US008838286B2

(12) United States Patent
Florez-Larrahondo et al.

(10) Patent No.: US 8,838,286 B2
(45) Date of Patent: Sep. 16, 2014

(54) RACK-LEVEL MODULAR SERVER AND STORAGE FRAMEWORK

(75) Inventors: German Florez-Larrahondo, Georgetown, TX (US); Jimmy Pike, Georgetown, TX (US); John Stuewe, Round Rock, TX (US); Joseph Sekel, Austin, TX (US); Richard Mills, Cedar Park, TX (US); Joe Vivio, Santa Rosa, CA (US)

(73) Assignee: Dell Products L.P., Round Rock, TX (US)

( * ) Notice: Subject to any disclaimer, the term of this patent is extended or adjusted under 35 U.S.C. 154(b) by 588 days.

(21) Appl. No.: 12/939,939

(22) Filed: Nov. 4, 2010

(65) Prior Publication Data
US 2012/0116590 A1  May 10, 2012

(51) Int. Cl.
G05D 23/00 (2006.01)
(52) U.S. Cl.
USPC .................. 700/300; 361/679.02; 165/104.33
(58) Field of Classification Search
USPC ............ 700/82, 300; 361/679.02; 165/104.33
See application file for complete search history.

(56) References Cited

U.S. PATENT DOCUMENTS

| 5,777,874 | A  | * | 7/1998  | Flood et al. ................. 700/82 |
| 6,182,199 | B1 | * | 1/2001  | Faust ............................ 711/163 |
| 6,836,030 | B2 |   | 12/2004 | Smith |
| 6,867,966 | B2 |   | 3/2005  | Smith |
| 6,909,611 | B2 |   | 6/2005  | Smith |
| 7,420,805 | B2 |   | 9/2008  | Smith |
| 2006/0282685 | A1 | * | 12/2006 | Bahali et al. ................ 713/300 |
| 2007/0027948 | A1 | * | 2/2007  | Engebretsen ................ 709/203 |
| 2009/0200987 | A1 | * | 8/2009  | Saito et al. ................... 320/134 |
| 2009/0265045 | A1 | * | 10/2009 | Coxe, III ..................... 700/300 |
| 2010/0032142 | A1 | * | 2/2010  | Copeland et al. ........ 165/104.33 |
| 2010/0172076 | A1 | * | 7/2010  | Cravens et al. ......... 361/679.02 |
| 2011/0090087 | A1 | * | 4/2011  | Berke et al. .................. 340/584 |

* cited by examiner

Primary Examiner — Mohammad Ali
Assistant Examiner — Sheela S Rao
(74) Attorney, Agent, or Firm — Baker Botts L.L.P.

(57) ABSTRACT

A modular rack-level server and storage framework is disclosed. The modular rack system includes a plurality of chassis placed in one or more racks and a plurality of sleds placed in each chassis. Each sled includes an information handling system, a shared fan module, a shared power module, and a shared management module. The shared fan module cools the plurality of sleds in each chassis and the shared power module supplies power to one or more sleds in one or more chassis. The shared management module manages the operation of the plurality of chassis.

47 Claims, 11 Drawing Sheets

RACK-LEVEL MODULAR SERVER AND STORAGE FRAMEWORK

TECHNICAL FIELD

The present disclosure relates generally to information handling systems, and, more particularly, to a modular rack-level server and storage framework.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system, such as a server system, may be placed within a rack. A rack may house multiple server systems, and multiple racks are typically placed in a room that is known as a data center or server room. A typical server room will include rows of racks. One difficulty of data centers is the heat generated by the multiple servers in the data center. Excessive heat leads to high cooling costs for a data center and can result in the degradation in the performance of the computer systems of the rack or data center. Additionally, servers often include active components. Once a server has been installed in a rack, the failure of an active component of the server may necessitate the need for service which increases the system cost and may be time consuming.

It is desirable to efficiently manage and monitor the servers that are located in a data center and minimize the post installation maintenance costs associated with the servers. Additionally, it is desirable to achieve optimal system efficiency by allowing the servers to share system resources such as the fans required to cool the servers and the servers' power distribution units.

SUMMARY

The present disclosure relates generally to information handling systems, and, more particularly, to a modular rack-level server and storage framework.

In one exemplary embodiment, the present invention is directed to a modular information handling system framework. The modular information handling system may include a rack containing at least one chassis; a sled placed within the chassis; wherein the sled includes at least one information handling system; a fan placed within the chassis to cool the information handling system; a fan controller communicatively coupled to the fan; wherein the fan controller manages operation of the fan; a node controller associated with the sled; wherein the node controller manages operation of the sled; a power module for supplying power to the information handling system; a power module controller for managing operation of the power module; and a primary domain controller communicatively coupled to the fan controller, the node controller, and the power module; wherein the primary domain controller manages the operation of at least one of the fan controller, the node controller and the power module.

In another exemplary embodiment, the present invention is directed to a modular rack system. The modular rack system may include a plurality of chassis placed in one or more racks; a plurality of sleds placed in each chassis; wherein each sled includes an information handling system; a shared fan module to cool the plurality of sleds in each chassis; a shared power module to supply power to one or more sleds in one or more chassis; and a shared management module to manage operation of the plurality of chassis.

Accordingly, the methods and systems disclosed herein provide efficient management and monitoring of information handling systems that may be located in a data center and minimize post installation maintenance costs associated therewith. Moreover, the methods and systems of the present application optimize system efficiency by permitting two or more information handling systems to share system resources such as power supplies and fans. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
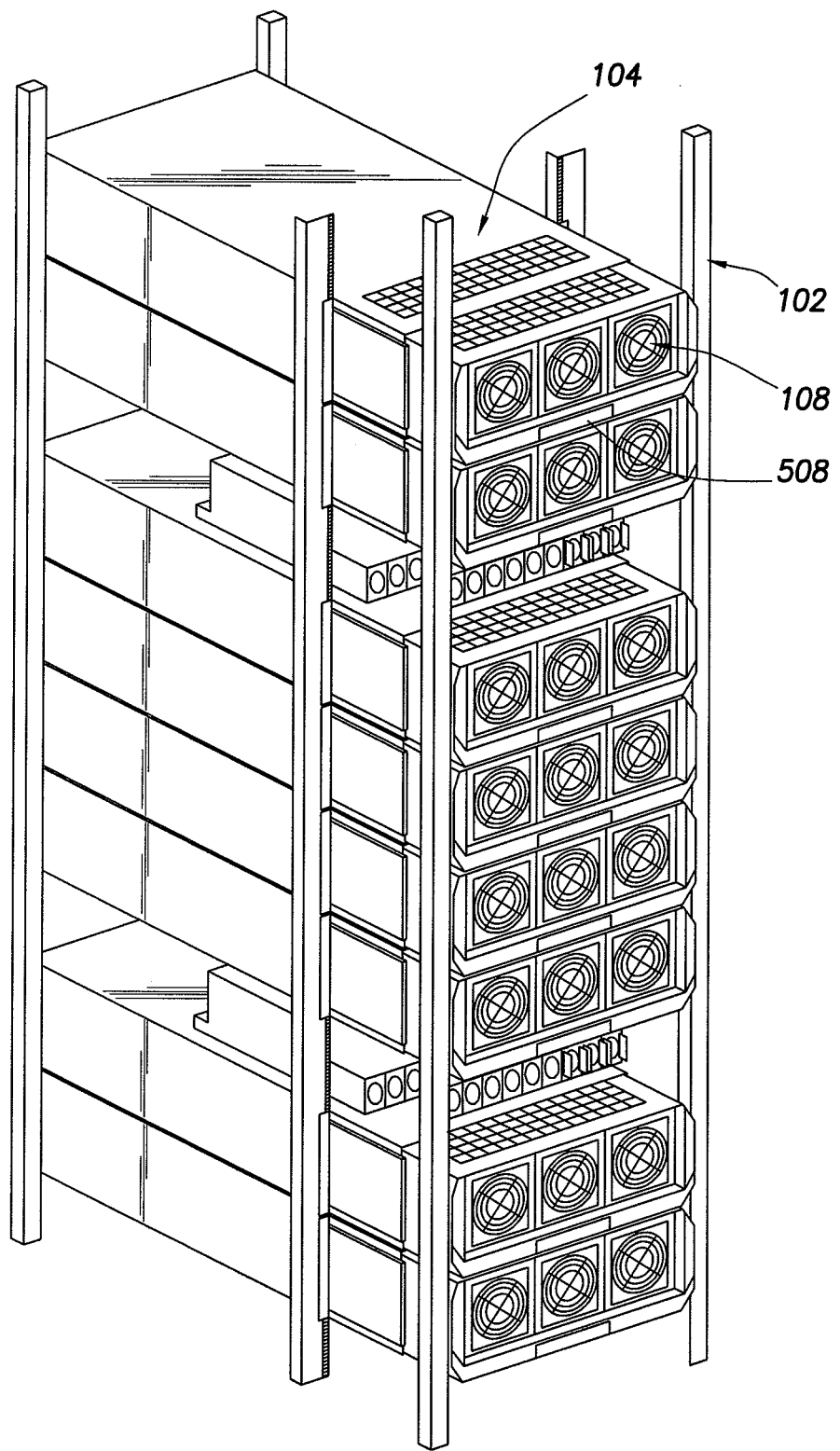
FIG. 1 is a pictorial view of modular rack system in accordance with an exemplary embodiment of the present invention.

An information handling system may be housed within a rack. For example, as shown in FIG. 1, servers and/or data storage devices in a data center may be arranged in a rack 102. As appreciated by those of ordinary skill in the art, the server may consists of at least a motherboard, a CPU and memory. A data center may include one or more racks 102 depending on the users' system requirements. The rack 102 may include one or more chassis 104. A chassis 104 in accordance with an exemplary embodiment of the present invention is a modular component which facilitates sharing critical server components among many servers. In one exemplary embodiment, the chassis 104 may be a 4 U chassis. Each chassis 104 is purposely void of active component within it or its backplane in order to minimize the need for service after it has been installed.

Figure 2:
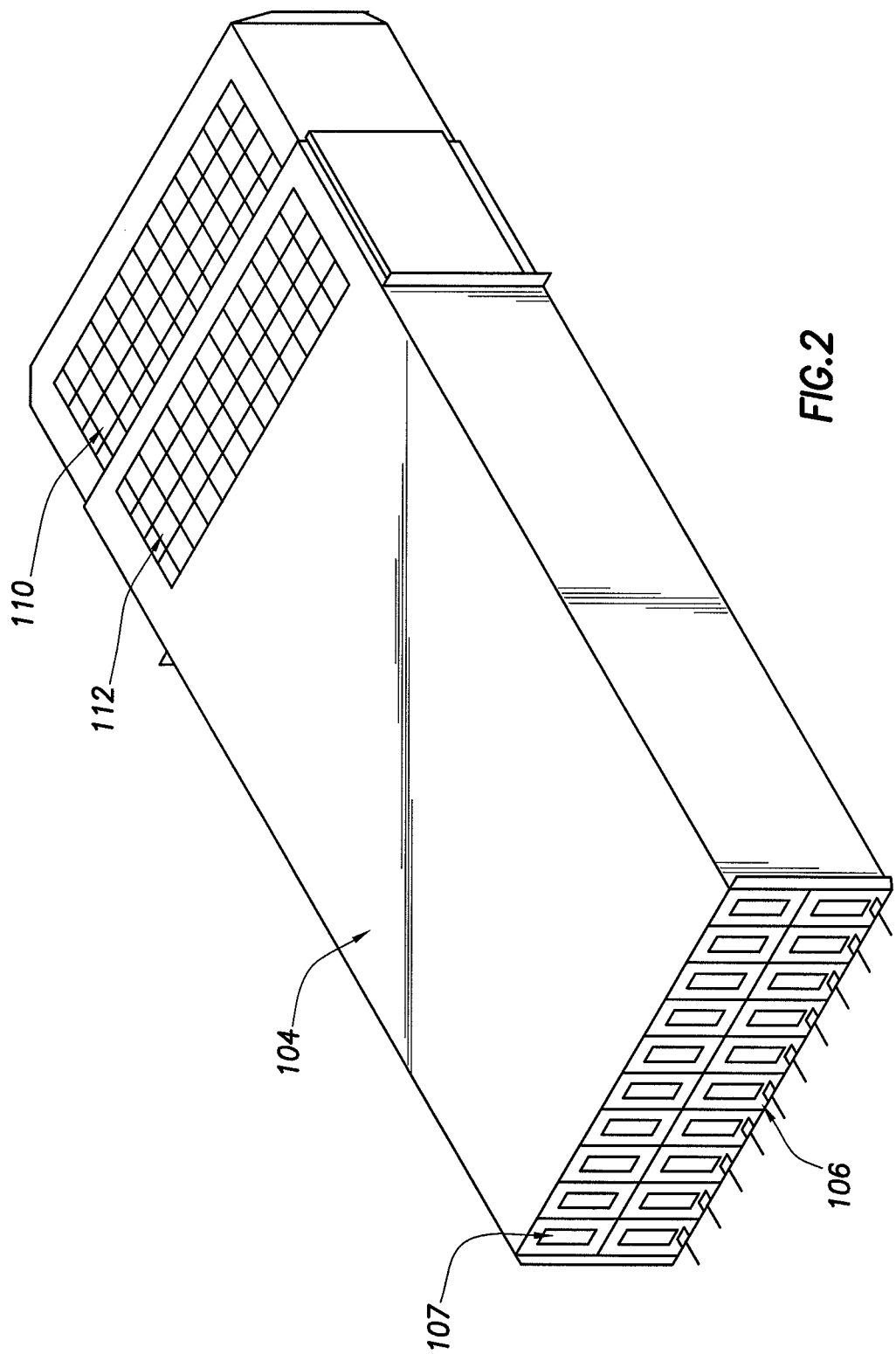
FIG. 2 is a pictorial view of a chassis in accordance with an exemplary embodiment of the present invention.
Figure 3:
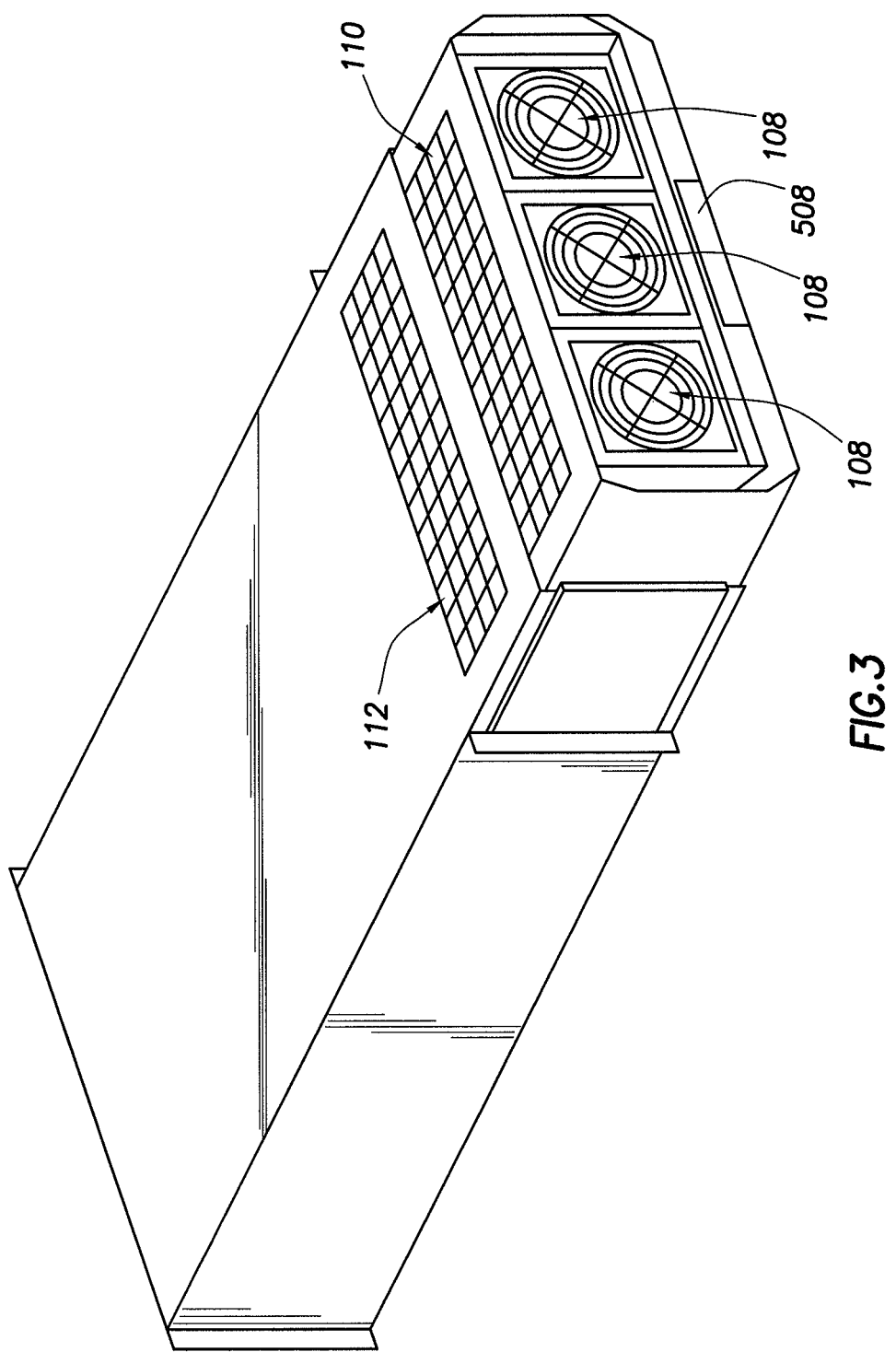
FIG. 3 is a perspective view of the chassis of FIG. 2.
Figure 4:
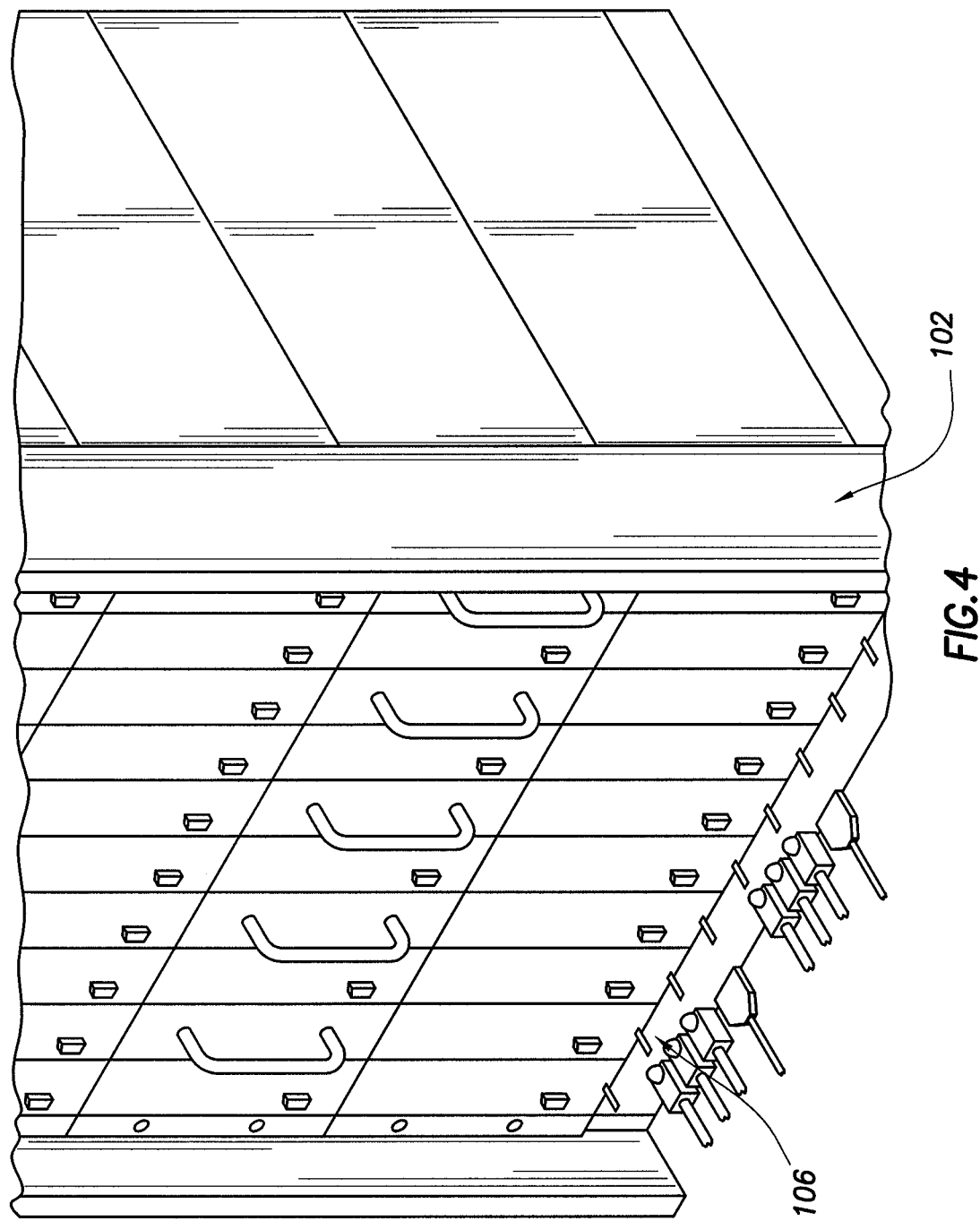
FIG. 4 is a close up view of a modular rack system in accordance with an exemplary embodiment of the present invention.

As shown in more detail in FIGS. 2 and 4, the chassis 104 may include sleds 106. The sled 106 may include one or more servers 107. The rack 102 may include one or more computational sleds, storage sleds, or a combination thereof. As would be apparent to those of ordinary skill in the art, with the benefit of this disclosure, although the computational and/or data storage sleds are vertically arranged in the exemplary embodiment, they may also be arranged horizontally. As shown in FIGS. 2 and 3, in one exemplary embodiment, the chassis 104 may include up to ten vertical computational sleds, five double wide sleds that contain twelve or more storage drives or a hybrid arrangement including a combination of computational and storage sleds. As would be appreciated by those of ordinary skill in the art, the present invention is not limited to any specific number or configuration of sleds 106 in a chassis 104. In the case of horizontal sleds, in one exemplary embodiment, four 1 U full-width sleds that support dense server in each 1 U, including four socket systems, may be used. As would be apparent to those of ordinary skill in the art, with the benefit of this disclosure, other arrangements of computational and storage sleds may also be used depending on the system requirements and/or preferences.

The chassis 104 may also include a shared fan module in a cooling zone 110 at the back of the chassis 104. In the exemplary embodiment, the shared fan module has a 4 U resolution. In one embodiment, three fans 108 may be used in the shared fan module to cool down all the sleds 106 in the chassis 104. However, more or less fans may be used in the shared fan module depending on the system performance and requirements. The fans 108 may be managed by a fan controller 508 whose operation is discussed in more detail below in conjunction with FIGS. 5 and 6. As would be appreciated by those of ordinary skill in the art, with the benefit of this disclosure, the fan controller 508 may be hot swapped from the back of the rack 102.

Additionally, each chassis 104 may receive power from cables that come out of the Power Distribution Unit ("PDU") which is discussed in more detail below in conjunction with FIGS. 5, 9 and 10. As discussed below, the PDU 902 may have one or more Power Supply Units ("PSUs") 904. Therefore, the power produced by all the PSUs 904 is shared among all the chassis 104 that are connected to the PDU 902. In turn, each chassis 104 will then distribute the power it receives among the individual sleds 106 contained in that chassis 104.

Between the cooling zone 110 and the sleds 106 there are backplanes 112. The chassis 104 may include a power and management backplane that distributes power to each one of the sleds 106. The power and management backplane may also carry high speed network signals (e.g. Ethernet) and low speed network signals (e.g. System Management Bus). In one embodiment, the system may further include an optional storage backplane that allows a computational sled to have access to one or more storage sleds in the same chassis 104 via SATA/SAS signals. The storage backplane connectors may be connected to the computational backplane connectors via STA/SAS patch cables.

Figure 5:
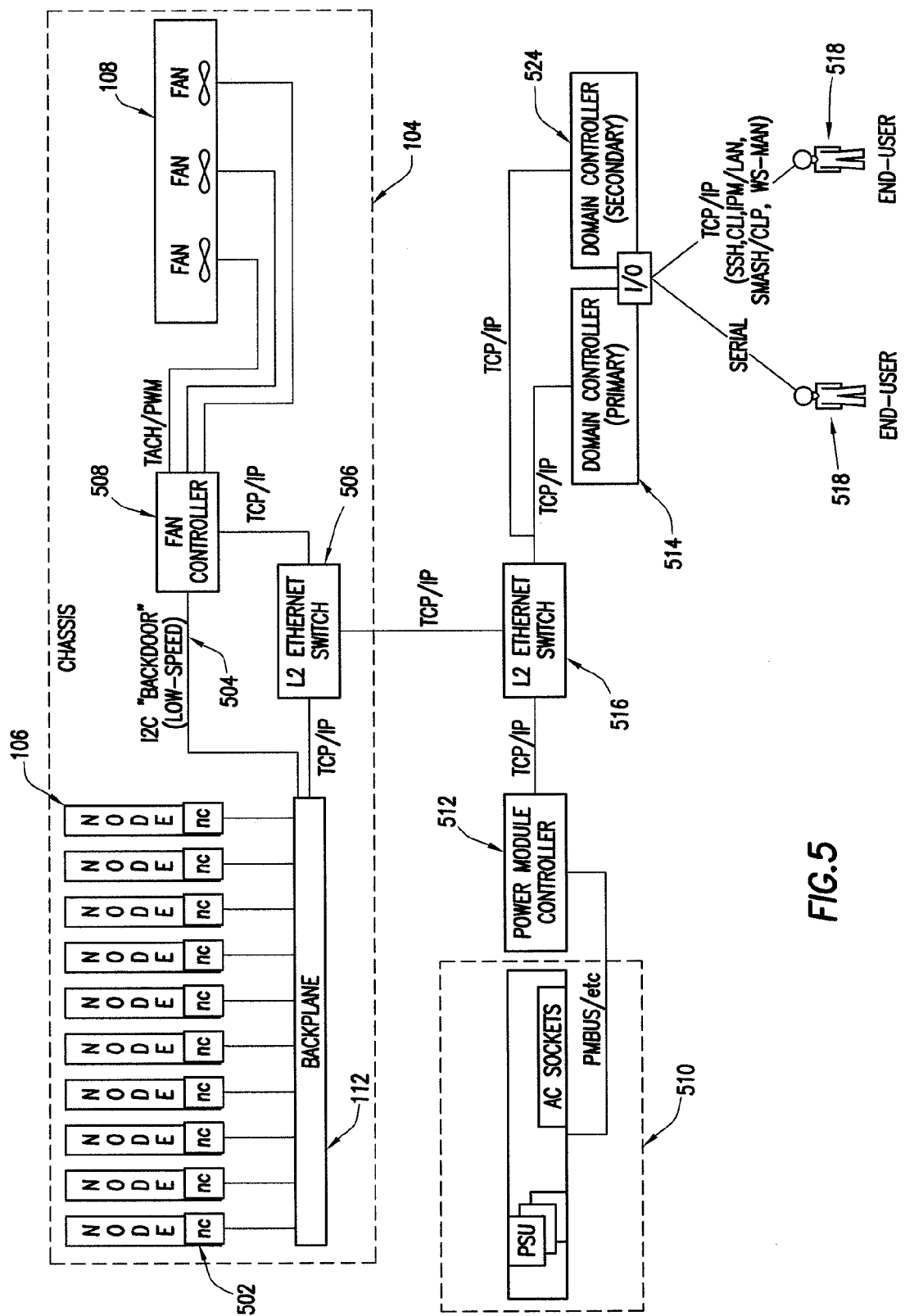
FIG. 5 is a block diagram of a system management framework for the modular rack system in accordance with an exemplary embodiment of the present invention.

As shown in FIG. 5, the system and methods disclosed herein provide a framework for shared cooling, shared power and shared managements of the sleds 106. Each sled 106 within the chassis 104 may be treated as a node that can be centrally managed over a network, such, for example, an Ethernet-based management network. A domain controller 514 may provide the access point for a user to manage the system. The operations of the domain controller 514 are discussed in more detail below. Accordingly, as shown in FIG. 5, each sled 106 may further include a node controller 502 that provides system management and monitoring capabilities. The node controller 502 may manage each of the servers 107 in a sled 106. The node controller 502 power manage the servers 107, turn on LED lights, read temperatures, forward data from the serial console, etc. It is also in charge of providing the proper voltage rails to power the server's 107 components. An end-user 518 does not directly interact with the node controller 502. Instead, the node controller 502 communicates with the domain controller 514 and other devices in the management network. The term "management network" refers to an internal network, not accessible to an end-user, that allows different controllers in the network to communicate among themselves, and specially to talk with the domain controller 514. In one exemplary embodiment, the management network may be an Ethernet 10/100 network. The term "domain" as used herein refers to a logical concept that indicates a set of sleds 106, fans 108, power supplies 510, 116 and other devices that are located in a rack 102 or distributed among a set of racks and that can be managed from the same domain controller 514.

The network may connect a consolidation switch 506 within each chassis 104 to a central management switch 516 at a central management domain controller 514 which provides a single (redundant) point of access for a user through an interface, such as, for example, Command Line Interface, Simple Network Management Protocol or Data Center Manageability Interface. The domain controller 514 allows an end-user to manage and monitor a domain. For instance, the domain controller 514 may manage all of the sleds 106, fans 108 and power supply units 510, 116 in one or more chassis 104. The domain controller 514 communicates with the low level controllers using the management network. As discussed herein, the term "low level controller" refers to node controllers, fan controllers and power controllers which offer functionality, but are not directly accessible to the end-user 518. The domain controller 514 may have a robust software stack to provide an end-user 518 with many ways to manage the system. In one embodiment, the system may include two domain controllers 514, 524. If the primary domain controller 514 fails, an automatic failover process may occur and the secondary controller 524 may take over and become the primary domain controller.

Under normal operating conditions, the primary controller 514 may have a connection to the secondary domain controller 524 through the management network. As would be appreciated by those of ordinary skill in the art, with the benefit of this disclosure, a number of suitable methods may be used to provide this connection. In one exemplary embodiment, the connection may be a TCP connection. The primary domain controller 514 may send a "I'm alive" message to the secondary domain controller 524 through the TCP connection every few seconds. The primary domain controller 514 may also send important updates to the secondary domain controller 524 such as registration messages, alarms, etc. through the TCP connection. The secondary domain controller 524 operates in a loop that checks the timestamp of the last "I'm alive" message received from the primary domain controller 514.

If the secondary domain controller 514 goes offline or otherwise becomes inoperable while the primary domain controller 514 is operational, the primary domain controller 514 will detect that the secondary domain controller 524 cannot be reached (the TCP connection is halted). An alarm may then be generated. The primary domain controller 514 will then make attempts to reconnect the TCP connection (sleeping a few seconds between tries). When a successful TCP connection is established with the secondary domain controller 524, an event is generated notifying the system that the error has been resolved.

If the primary domain controller 514 goes offline or otherwise becomes inoperable while the secondary domain controller 524 is operational, the secondary domain controller 524 will no longer receive the "I'm alive" message. If the secondary domain controller 524 does not detect an "I'm alive" message after a pre-set time has elapsed, it will recognize that the primary domain controller 514 has become inoperational. In response, the secondary domain controller 524 may create an alarm to the system and/or change its mode to become the primary domain controller for the system. The low level controllers may not notice the change in the domain controller immediately. As a result, a few "old" sensor data packages may be lost while the transition takes place. However, up-to-date sensor data will be cached as soon as the secondary domain controller 524 takes over. Similarly, due to the failure of the primary domain controller 514, a user interface at the primary (e.g. Command Line Interface or Web Service) may be interrupted. However, after a few seconds when the transition occurs, a new attempt to connect will be successful and the user can retry the commands. Next, the new primary domain controller will try to establish a TCP session with a new secondary domain controller.

Figure 11:
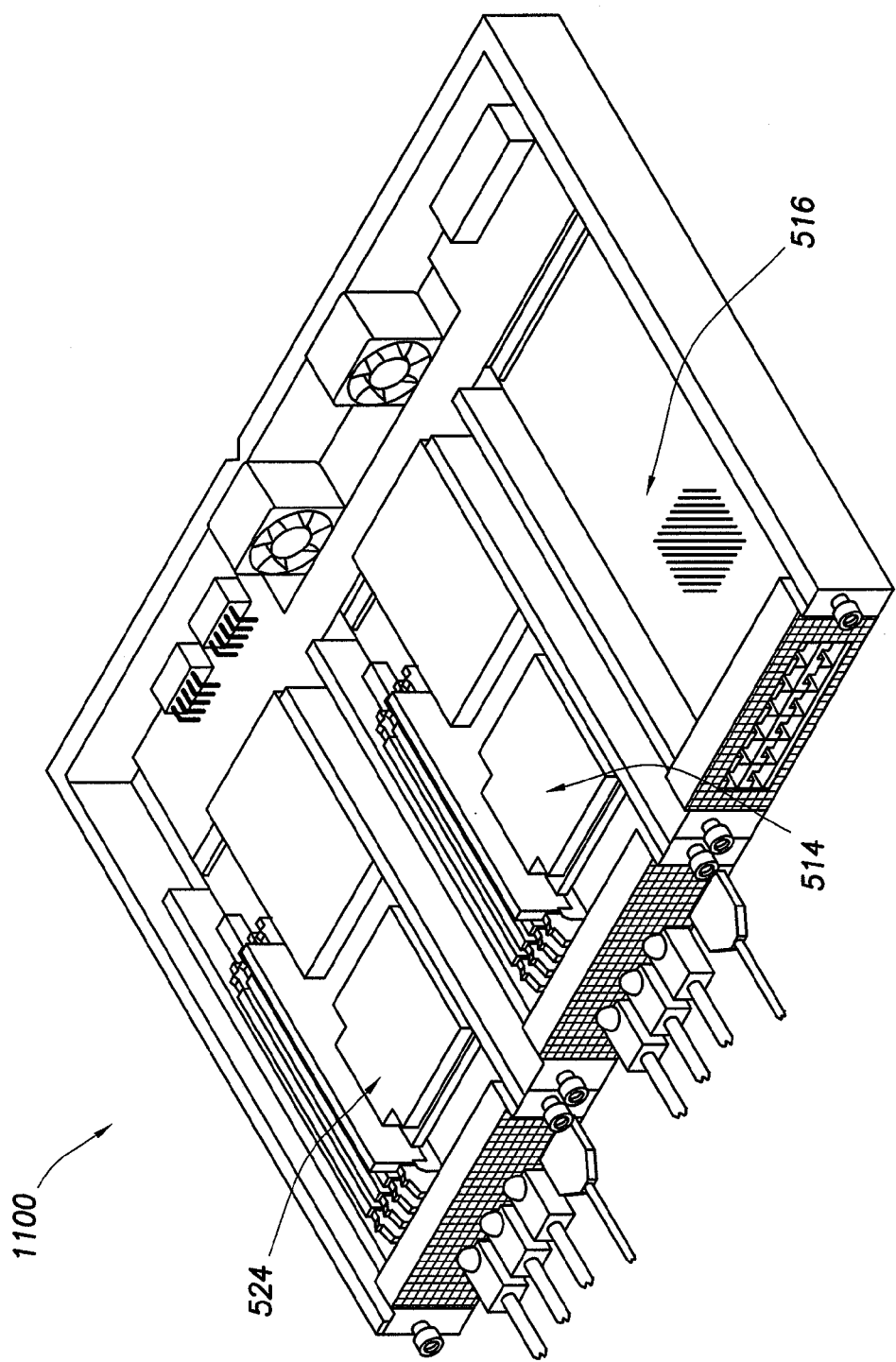
FIG. 11 depicts a management appliance in accordance with an exemplary embodiment of the present invention.

FIG. 11 depicts a management appliance 1100 in accordance with an embodiment of the present invention. The management appliance 1100 may contain up to two domain controller 514, 524 and an Ethernet switch 516. A system in accordance with an embodiment of the present invention may include up to one management appliance 1100 per rack 102. In instances when a user desires system redundancy, the management appliance 1100 may include both a primary domain controller 514 and a secondary domain controller 524. In contrast, when the user does not require redundancy, the management appliance 1100 may only include a primary domain controller 514. Additionally, multirack systems that do not require redundancy may include one rack 102 with a management appliance 1100 having one domain controller and an Ethernet switch and the other management appliance 1100 with just the switch. A management appliance 1100 in accordance with an embodiment of the present invention may include a rotary switch that can be set with the location of the rack 102, so that each rack 102 can be assigned a different number. This is part of the location information that each device in the system has. For instance, a sled 106 will have a given Rack/Chassis/Sled identification associated therewith.

Returning now to FIG. 5, in order to manage and monitor the sleds 106, the node controller 502 associated with a sled 106 may have a physical connection to sensors, motherboard and expansion boards that provide management of multiple servers 107 in a sled 106. The node controller 502 may run on a microprocessor. In one embodiment, the microprocessor may include a small embedded Operating System. One of the main responsibilities of the node controller 502 may be to provide and manage power to the sleds 106, including motherboards, hard drives, and/or storage sleds associated with a sled 106. Power management commands may be provided to the node controller 502 from a panel on the chassis 104, through the management network and/or a Baseboard Management Controller ("BMC"). The node controller 502 may be in charge of data collection and alerting. The node controller 502 may then periodically send data to the domain controller 514 and/or send notifications to the domain controller 514 when interesting events occur. Additionally, the node controller 502 may send sensor data to the chassis' fan controller 508. For example, in addition to sending chassis' sensor data such as temperature sensor data to the domain controller 514 to be stored, the node controller 502 may also send sensor data to the fan controller 508 of the chassis 104. The fan controller 508 may then use the sensor data to control the speed of the fans 108.

The fan controller 508 may include software to control and monitor the speed and status of the fans 108 and notify the domain controller 514 of any critical issues with the fans 108. The fan controller 508 may communicate with a domain controller 514 over the management network. The fan controller 508 may receive temperature data from all the node controllers 502 located in the same chassis 104 in order to regulate the fan speeds to comply with the thermal requirements of the system. The fan controller 508 may include a main configuration file that its different components must read at start up and that can be overwritten from the domain controller 514. Specifically, the parameters that control the behavior of the fan controller 508 such as polling frequency, default debug levels, etc. must be read from configuration file and can be overridden for testing or tuning purposes by the domain controller 514.

Figure 6:
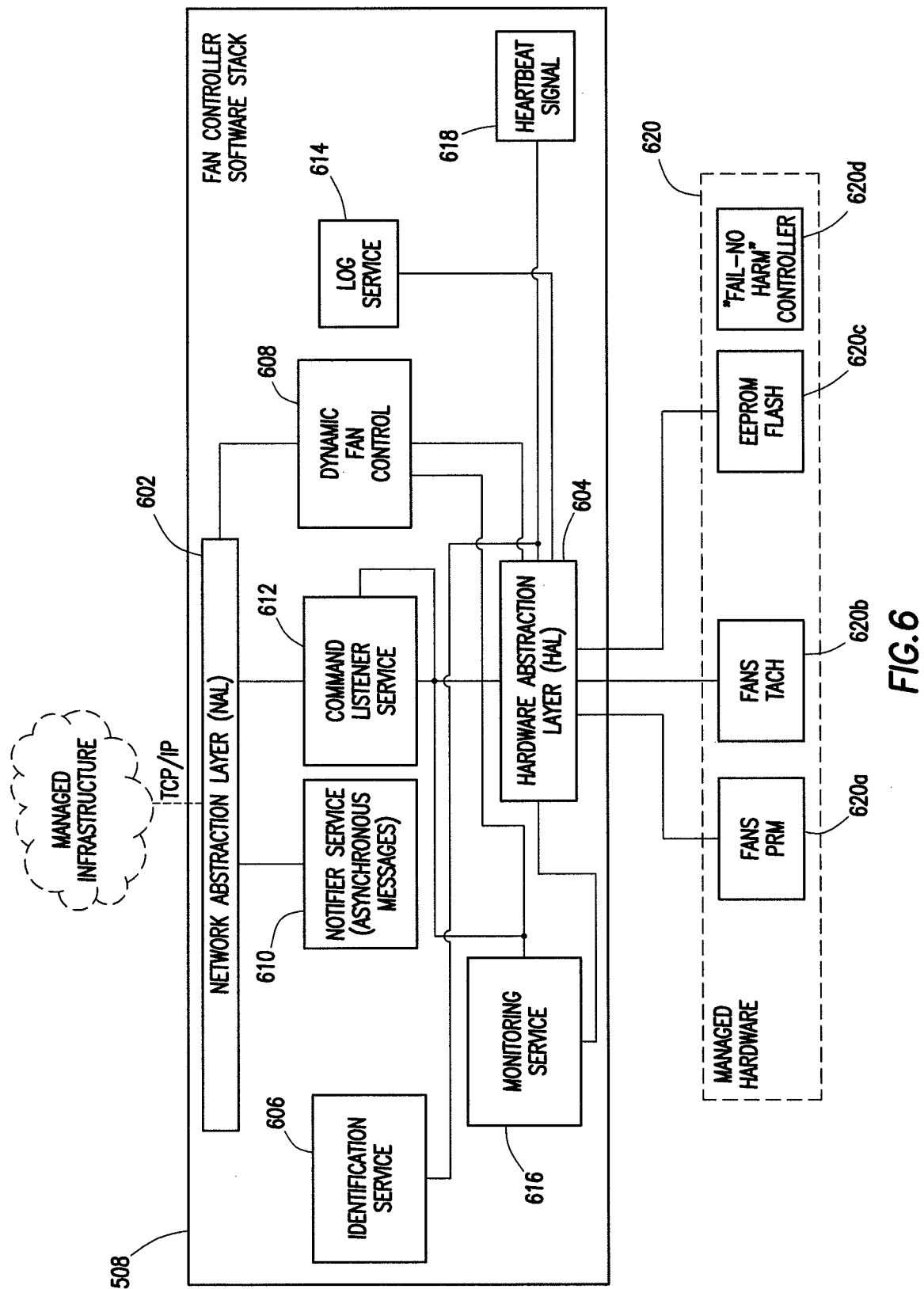
FIG. 6 is a block diagram of the software stack for the fan controller of FIG. 5 in accordance with an exemplary embodiment of the present invention.

Turning now to FIG. 6, a block diagram of the components of the fan controller 508 are depicted. The fan controller 508 may include a network abstraction layer 602 and a hardware abstraction layer 604. The interconnections among the services in the fan controller 508 may be implementation dependent and will be largely impacted by the underlying hardware. For instance, the interconnections may be simple call to loaded libraries, shared memory, or inter-process communication frameworks like queues. The network abstraction layer 602 allows the fan controller 508 to send and receive messages from the network without being concerned with the underlying network protocol being used. The fan controller 508 may include an identification service 606 that determines the physical location of the fan controller 508. Specifically, the first task of the fan controller 508 may be to identify itself. Since a fan controller 508 is located in a chassis 104 in a rack 102, this identification may be based on the physical location of the fan controller 508. Using the hardware abstraction layer 604 the fan controller 508 will determine the chassis number that it is associated with. The chassis number will be known as the location string and may be assigned to a hostname of the fan controller 508. As would be appreciated by those of ordinary skill in the art, with the benefit of this disclosure, based on the physical location of the fan controller 508, a static address may be assigned to the fan controller 508. Once an IP address is assigned to the fan controller 508, any other service in the fan controller 508 must be restarted. The fan controller 508 will then validate that the address is unique in the network. If the assigned address is not unique, the fan controller 508 will send an error to the log service 614 and attempt to get an address from a reserved pool of addresses.

In one embodiment, a dynamic fan controller 608 may be provided to regulate the speed of the fans 108. Sensors (not shown) may be placed in the system. The dynamic fan control 608 may receive periodic sensor readings from one or more sensors of the chassis 104 and dynamically adjust the speed of the fans 108 using a PID controller algorithm that is fed with sensor data from the sleds 106 in the chassis 104 and other ambient sensors located in front of the chassis 104. For instance, the dynamic fan control 608 may receive the following sensor data from each sled 106: outlet ambient temperature (based on the node controller 502 temperature probes); CPU temperature (from the BMC); DIMM temperature (from the BMC); and the sled power consumption. Additionally, the dynamic fan control 608 may receive periodic sensor readings from the chassis 104 such as the ambient temperature. For each of the sensor readings there will be a discrete PID controller in the dynamic fan control 608. As would be appreciated by those of ordinary skill in the art, with the benefit of this disclosure, the PID controller(s) may control the fan speed based on the one or more variable received from the sensors used in the system. If there is a sensor failure, the fan controller 508 fails, or if the dynamic fan control 608 otherwise fails and cannot be recovered, the fans 108 will be directed to operate at maximum speed.

Because the operation of such a feedback control system is known to one of ordinary skill in the art, it will not be discussed in detail herein. If one of the fans 108 of the fan module fails, the fan controller 508 will direct the remaining fans to perform at maximum speed. In one exemplary embodiment, in case of a firmware failure, the fans 108 may be set to operate at maximum speed while the fan controller 508 is restarted.

The notifier service 610 of the fan controller 508 may send messages from the fan controller 508 to the domain controller 514 and other receivers. Messages may include data updates or interesting events (e.g. fan errors). The first task of the notifier service 610 is to notify the domain controller 514 that the fan controller 508 is ready. Additionally, after the initial "registration", the notifier service 610 may forward messages received from the other components of the fan controller 508 to the domain controller 514 and other devices (e.g. dynamic fan control 608). The fan controller 508 may also include a command listener service 612 that receives messages or commands from the domain controller 514 through a connection-oriented session that has been previously created. The command listener 612 may queue incoming requests and satisfy them one request at a time. The maximum size of the queue may be read from the configuration file. As a result, the methods being executed from the command listener 612 to perform management and monitoring operations do not need to be thread-safe, although using a thread-safe method is recommended. While only one connection may be needed from the domain controller 514 under normal operating conditions, it is desirable to have the ability to allow more than one connection in the queue for debugging purposes so that a test client can send commands to the fan controller 508 even though it is connected to some domain controller 514.

The fan controller 508 may further include a log service 614 that receives messages from other components of the fan controller 508 and stores them in a physical media which may be a permanent location (e.g. EEPROM). The log service 614 may rotate the logs in the physical medium so that it is never full and the most recent messages remain available. The maximum size of the log is dependent on the hardware resources available and may be part of the configuration file. For instance, in one embodiment, the number of messages in the log service 614 may be 500 while in another embodiment, it may be 20.

Additionally, the fan controller 508 may include a monitoring service 616 which for each sensor of interest (e.g. speed sensor) keeps the last read value and fires events of interest (e.g. fan error) to the notifier service 610 if the sensor data fall outside a predetermined acceptable range. Further, the monitoring service 616 may send periodic updates of dynamic data to the domain controller 514 via the notifier service 610. In one embodiment, the monitoring service 616 may constantly poll data from the hardware abstraction layer 604 for each "sensor" at a pre-set frequency and may store a predetermined number of sensor readings in memory. The stored sensor readings may then be used to calculate an average value for the particular sensor that is reported when the monitoring service 616 is asked about a sensor. The number of sensor data to be stored and the sampling rate may be set in the configuration file.

In one embodiment, the monitoring service 616 of the fan controller 508 may use the sensor data received and compare them to three operative ranges to determine if the fans 108 are operating in the normal range, the warning range or the alarm range. Every time a sensor enters into one of those ranges, the monitoring service 616 of the fan controller 508 may fire an event to the notifier service 610 which will notify the end-user 518 through the domain controller 514. The ranges for each category may be set in the configuration file through the domain controller 514.

Finally, the fan controller 508 may include a heartbeat signal 618 which is a low-end device that polls the fan controller 508 at a pre-set frequency and will reset the fans to operate at full speed if it does not receive a reply from the fan controller 508.

In order to create a flexible and maintainable code, the fan controller services may be arranged so that they do not interact directly with the hardware. Instead, the fan controller 508 may include a hardware abstraction layer 604 which acts as an interface between the services and the hardware 620. For instance, if the command listener service 612 receives a command to turn a fan 108 off, the command listener 612 may send a request to the hardware abstraction layer 604 which knows the physical medium and the protocol to perform the task. As would be apparent to those of ordinary skill in the art, with the benefit of this disclosure, the fan controller 508 may manage a number of hardware devices 620, including, but not limited to fan PWM 620a, fan tach 620b, EEPROM/Flash 620c, and "fail no harm" controller 620d.

Returning now to FIG. 5, the node controller 502 may perform management and monitoring operations requested by the domain controller 514 such as the power management of the server. The node controller 502 may communicate with the domain controller 514 using the management network.

The domain controller 514 may include a main configuration file that the different components of the node controller 502 must read at start up. This configuration file may be overwritten from the domain controller 514. Accordingly, the parameters that control the performance of the node controller 502 such as polling frequency, default debug levels, etc., must be read from the main configuration file and may be overridden for testing and/or tuning purposes. The presence of the main configuration file removes hard coding from the code and allows easy performance of minor modifications during testing of the system. Additionally, a copy of the original configuration file may be maintained in the system to allow a "reset" whereby the original configuration file is written into the node controller and the system is restarted.

Figure 7:
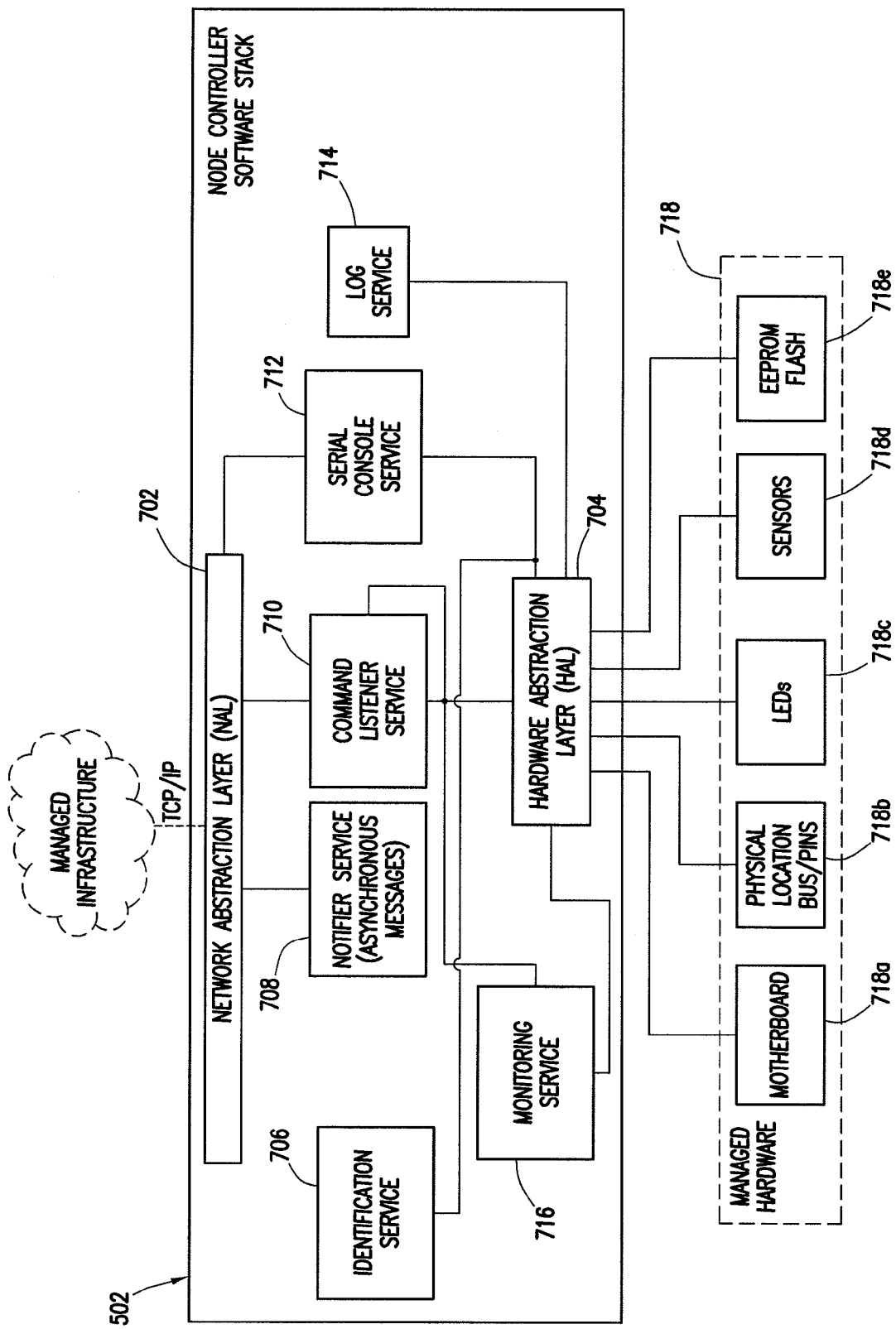
FIG. 7 is a block diagram of the software stack for the node controller of FIG. 5 in accordance with an exemplary embodiment of the present invention.

Turning now to FIG. 7, a block diagram of some exemplary components of the node controller 502 are depicted. The node controller 502 may include a series of well-defined services and make use of a network abstraction layer 702 and a hardware abstraction layer 704 that gives the software flexibility and portability. The interconnection among the services may be implementation dependent and may be impacted by the underlying hardware. In some embodiments, this can be simple method calls to loaded libraries, shared memory, or inter-process communication frameworks like queues.

The network abstraction layer 702 may allow the software to send and receive messages from the network, without being concerned with the underlying network protocol being used. One of the first tasks of the node controller 502 is to identify itself to the system. In one embodiment, the node controller 502 may identify itself to the system by specifying its physical location which may be in a specific rack 102, chassis 104 and sled 106. Accordingly, one of the first components to start up may be the identification service 706 which determines the physical location of the node controller 502. Using the hardware abstraction layer 704, the node controller 502 will determine the chassis number and node number inside the chassis 104 where it is located. A static address may then be assigned to the location of the particular node controller 502. Once an IP address is assigned, any other services in the node controller 502 must be restarted. The node controller 502 may then ensure that the assigned address is unique to the network. If the address is not unique, the node controller 502 may log an error and attempt to get an address from the reserved pool. The identification process may be executed frequently (e.g. every ten seconds) and if the location is changed, it should re-register.

The notifier service 708 may send messages from the node controller 502 to the domain controller 514 and other receivers. These messages may include data updates (e.g. sensor data) and/or interesting events (e.g. change of state and errors). The first task of the notifier service 708 is to notify the domain controller 514 that the node controller 502 is ready and "register" the node controller 502 with the domain controller 514. If the initial attempt to register the node controller 502 is unsuccessful, then the notifier service 708 may wait a predetermined amount and keep trying until a connection is established. Additionally, the notifier service 708 may forward messages from the other services and/or modules in the node controller 502 through the management network. In one embodiment, the notifier service 708 may send messages to the domain controller 514 at pre-set intervals to detect the unlikely event that both of the primary domain controller 514 and the secondary domain controller 524 (discussed in more detail below) are offline. Once the registration has been completed, the notifier service 708 may read sensor and other dynamic data from the hardware being managed by the node controller 502; determine if the readings cause interesting events to be fired by the notifier service 708 by comparing them with an acceptable range; and send periodic updates of dynamic data to the domain controller 514 via the notifier service 708.

The node controller 502 may also include a command listener service 710. The command listener service 710 may receive messages or commands from the domain controller 514 through a connection oriented session that may have been previously created. The command listener service 710 may queue incoming requests and satisfy them one request at a time. Accordingly, the methods being executed from the command listener 710 to perform management and monitoring operations need not be thread-safe. In one embodiment, more than one connection may be allowed in the queue.

Additionally, the node controller 502 may include a serial console service 712. The serial console service 712 may run in two modes. The first is the buffered mode where the node controller 502 collects any data from the server's 107 console port and stores it in a rotating buffer. The second mode is the interactive mode which allows the end-user 518 to interact with the serial console of a server 107 via the node controller 502. The implementation of the interactive mode emulates an end-user 518 being connected directly to a serial port of the serial console service 712, even though in reality any communication between the end-user 518 and the serial console service 712 must go through the domain controller 514 and the node controller 502. In one embodiment the buffered mode may be the default mode of service for the serial console service 712. The buffer may have a FIFO design with the older bytes of data being dropped to allow new bytes to be added at the top of the buffer.

A log service 714 may also be provided to receive messages from other components of the node controller 502 and store them in a physical media such as, for example, an EEPROM. The node controller 502 may also include a monitoring service 716 for each sensor that is monitoring a system characteristic of interest (e.g. temperature, power consumption, voltage, current, etc.). In one embodiment, the monitoring service 716 may constantly poll data for each managed hardware 718 from the hardware abstraction layer 704. The monitoring service 716 may keep a last reading value of the sensor and may fire events to the notifier service 708. For instance, if the temperature sensor (not shown) indicates a temperature the exceeds a pre-set safety threshold, the monitoring service 716 may fire an event to the notifier service 708, informing the notifier service 708 of that fact. In one embodiment, potential system errors may be reduced by having a value of a characteristic of interest stored by the monitoring service 716 that is an average of a number of sensor readings over a pre-set time interval. In one embodiment, the sensor data may be compared to an "acceptable range" for a particular sensor to determine if a threshold limit has been reached. The monitoring service 716 may push the sensor data to the domain controller 514 and/or other receivers (e.g. fan controllers 508) at a pre-determined frequency. In one embodiment, the monitoring service 716 may also interact with the BMC of the sleds 106 to collect and/or push data.

As would be appreciated by those of ordinary skill in the art, with the benefit of this disclosure, the node controller 502 services may manage a number of hardware components 718, including, but not limited to, motherboard 718a, physical location bus/pins 718b, LEDs 718c, sensors 718d, and EEPROM/FLASH 718e. However, in order to create a flexible and maintainable code, the node controller 502 services may not interact directly with the system hardware being managed 718. Instead, the node controller 502 services may use a hardware abstraction layer 704 that abstracts the hardware. For example, when the command listener service 710 receives a command to turn an LED 718c off, the command listener service 710 may send a request to the hardware abstraction layer 704. The hardware abstraction layer 704 knows the physical medium and protocol to manage the LED. As a result, in the event that the hardware where the node controller 502 runs is changed, only the hardware abstraction layer 704 and maybe the network abstraction layer 702 need to be changed while the other system components remain essentially the same. The node controller 502 is much cheaper than a full-feature Baseboard Management Controller but provides the most critical capabilities that customers of a hyper-scale data center may desire.

Returning now to FIG. 5, I2C signals 504 may be used to indicate to each sled 106 its position in the chassis 104. Additionally, the I2C signals 504 may be used as a backdoor to send/receive data in case the node controller 502 cannot get an IP address or the Ethernet switch 506 is damaged. In the back of each chassis 104 there may be a switch 506 that creates an Ethernet network, allowing the node controller 502 to communicate with other devices.

As shown in FIG. 5, the system may include one or more power modules 510 that may supply power to one or more chassis 104. The power module 510 may include a power distribution unit ("PDU") that receives power from the data center and/or AC sockets that feed third party components and provides power to the chassis 104. The power module 510 may be coupled to a power module controller 512 that provides management and monitoring capabilities for the power module 510 which may include PDU, PSUs, AC sockets, etc. The power module controller 512 may communicate with a domain controller 514 over the management network. Accordingly, the system may include a shared power subsystem that distributes power from the power module 510 to one or more chassis 104. The operations of the shared power supply system is discussed in more detail in conjunction with FIG. 9.

In one exemplary embodiment, the chassis 104 may also include a battery backup 116. The battery backup 116 provides DC power to the servers 107 in case of PDU failures. The power module controller 512 provides the management and monitoring for the battery backup 116. The power module controller 512 may only extract the most critical setting and metrics provided by the battery backup 116 (e.g. status of the battery, remaining time, etc) and expose those to the end-user 518. Any alarms and/or events generated by the battery backup 116 may also be propagated by the power module controller 512.

As discussed in more detail below, the domain controller 514 may be operable to perform one or more of the following functions depending on the system requirements: display an inventory of all the devices in the chassis 104; allow set and show of chassis information such as chassis name, chassis type and chassis height (e.g. 42 U) to allow inventory management; power manage the servers in one or more sleds 106; monitor the power consumed by each device in the rack as well as the overall power consumption; monitor the temperature of the different sensors in the controllers of the chassis 104; monitor fan speeds; provide an aggregation of critical measures such as maximum temperature, average temperature, device errors, etc; detect failure of any controllers in the chassis 104 and other critical conditions; allow the controllers in the chassis 104 to be upgraded without interfering with system performance; maintain a history of sensor data in a database and provide statistical performance data; allow chassis level power capping when the total rack power consumption exceeds a pre-set threshold, when there is a failure in the power supplies or to adjust to the system workloads.

The domain controller 514 may be connected to a switch 516 that is used to aggregate the switches in the chassis 104. An end-user 518 may manage any device in the rack using the domain controller 514. This includes power management and monitoring, sensor monitoring, serial over LAN, detection of critical alarms in the rack, and/or other system characteristics that are desired to be monitored or controlled.

Figure 8:
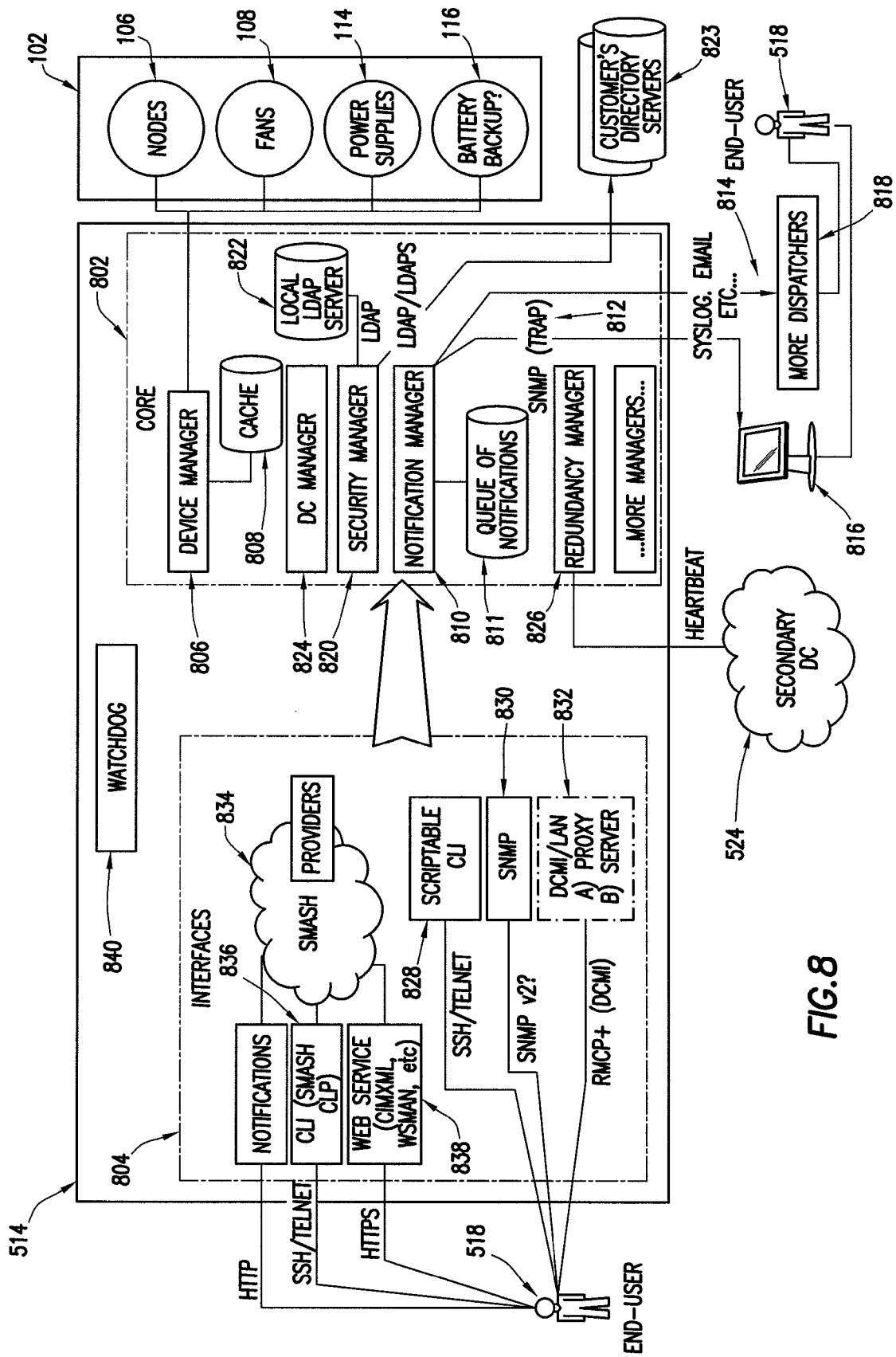
FIG. 8 is a block diagram of the software architecture for the domain controller of FIG. 5 in accordance with an exemplary embodiment of the present invention.

The operation of the domain controller 514 is described in more detail in conjunction with FIG. 8. As shown in FIG. 8, the two main components of the domain controller 514 are managers 802 and interfaces 804. A manager is a module that is in charge of management and monitoring of a specific piece of the system and interfaces are the code that provide management and monitoring capabilities to the end-user 518. The managers 802 may contain objects stored in a database. There may be an object corresponding to every device in the system from the rack 102 to the domain controller 514 itself. Objects will have properties and methods. For instance, a rack object may have properties like maximum temperature, total power consumption, etc. and methods like power management (on/off). The objects may be stored in tables of a database that contains the most up-to-date data.

The interfaces 804 receive commands from the end-user 518 and communicate with the proper manager 802 to satisfy the requests. Accordingly, the interfaces 804 and managers 802 are separated such that, for example, a code that reads power measurements from a node controller 502 has nothing to do with the code that allows the domain controller 514 to be restarted.

The managers 802 may include a device manager 806. The device manager 806 may be communicatively coupled to a cache 808 of sensor data provided by the low level controllers. A single domain controller 514 may interact with many low level controllers. For instance, the device manager 806 may receive sensor data from the sleds 106, the fans 108, the chassis' power supply 114 and the battery back up 116. The low level controllers may push data to the device manager 806 of the domain controller 514. The device manager 806 may store this data in a cache 808 so that it can be quickly retrieved when the end-user 518 requests monitoring data. Additionally, the device manager 806 may store data in a database which will allow the user 518 to dump historical data and permit the device manager 806 to provide the user 518 with statistical data relating to system performance. For instance, in one exemplary embodiment, sensor data from each low level controller may be collected in a central cache 808. After a predetermined sampling interval, the whole cache 808 may be dumped to the database. Additionally, the cache 808 may provide instantaneous monitoring data that a consumer requires. For instance, a query by the end-user 518 regarding the real time power consumption of a sled 106 may be satisfied from the cache 808 without necessitating the need for a TCP command to be sent from the device manager 806 to the node controller 502.

In the unlikely event that the domain controller 514 receives a package from a low level controller that has not been registered, the domain controller 514 will generate an event, examine the underlying User Datagram Protocol package, get the IP address of the low level controller, and send a command to get controller information, so that the cache 808 can be updated. As would be appreciated by those of ordinary skill in the art, with the benefit of this disclosure, this should only happen if a low level controller has registered with the Domain Controller 514 and the domain controller 514 goes offline before the update is sent to the secondary, redundant domain controller 524.

The low level controllers (e.g. node controller 502) have the ability to execute one command at a time. In contrast, for scalability purposes, more than one command may be executed by a domain controller 514 at a given time. In one embodiment, the device manager 806 component of the domain controller 514 may include a Task Pool Architecture as used in web servers available from the Apache Software Foundation, incorporated in Delaware, to permit the execution of more than one command at a time. Specifically, using the Task Pool Architecture, a set of threads may operate in parallel to execute a set of commands. For example, 100 nodes may be power managed by having 10 threads power managing 10 nodes.

In one exemplary embodiment, if the cache 808 detects that a low level controller has not updated its data in a timely manner, it may send a "getsensordata" signal to the specific low level controller. The amount of time allowed to lapse before a "getsensordata" signal is sent to the specific low level controller may be preset by the user 518 depending on the system requirements. If the delivery of the "getsensordata" signal to the particular low level controller fails, or if the cache 808 does not receive a responsive signal from that low level controller, the cache 808 may remove the stale data relating to that low level controller and generate an event to provide notification of the problem.

In one exemplary embodiment, the domain controller 514 may further include a notification manager 810. The notification manager 810 acts as a "container" for the events and alarms in the system which may be queued 811 and delivered to the notification manager 810. For example, the notification manager 810 may contain information that "the system has started" or that "temperature sensor in node 1 exceeds critical threshold." The notification manager 810 is in charge of dispatching events of interest (e.g. temperature above threshold value, system has initiated, etc) to different targets. In one embodiment, the notification manager 810 may dispatch the events and/or alarms to a Simple Network Management Protocol (SNMP) trap 812 which may be used to monitor network-attached devices for conditions that warrant administrative attention. The operation of a SNMP trap is well known to those of ordinary skill in the art and will therefore not be discussed in detail herein. Similarly, as would be appreciated by those of ordinary skill in the art, with the benefit of this disclosure, the notification manager 810 may dispatch the events and/or alarms to other targets, such as, for example a log, a Syslog 814 or other suitable targets. The SNMP trap 812 and/or the Syslog 814 may be used to notify an end-user 518 of the events and/or alarms contained in the notification manager 810 through a user interface 816 and/or other dispatchers 818.

In one embodiment, the domain controller 514 may further include a security manager 820. The security manager 820 is in charge of authentication and/or role base authorization. The authentication may be carried out using a local or a remote directory. In one embodiment, the local directory may operate under the Lightweight Directory Access Protocol ("LDAP"). The directory may contain information about the users on a local LDAP server 822 and may be extendable to add additional information if/when necessary. By default, the system may include a local LDAP server 822 with local users (e.g. an administrator). However, an end-user 518 may add another LDAP server or similar Customers Directory Servers 823 so that the domain controller 514 understands other users. Accordingly, in one exemplary embodiment, the domain controller 514 may by default have three users: guest, administrator and operator. That information may be stored in the local LDAP server 822. However, an end-user 518 may have its own Customer Directory Servers 823 with hundreds of users. The end-user 518 should be able to link its own Customer Directory Server 823 to the domain controller 514 so that the domain controller 514 can now be used by any of those hundreds of users. The information for most users may be stored in a local LDAP directory (e.g. Openldap). As would be appreciated by those of ordinary skill in the art, with the benefit of this disclosure, if the domain controller 514 runs on the Linux system, the Linux system must be aware that user information is stored in the local LDAP directory and must allow Secure Shell (SSH) or Telnet authentication of the users via LDAP.

Every system manager must check with the security manager 820 to determine whether an action can be performed or not, allowing for a role based access control. In one embodiment, the system may only permit two roles: (1) a guest role with read-only privileges and (2) an administrative role with read/write privileges.

Additionally, the security manager may set the firewall and restrict traffic going into and out of the domain controller 514. In one embodiment, the operations of the system may be simplified by having the security manager 820 allow all the outgoing traffic while restricting the incoming traffic.

In one embodiment, the domain controller 514 may include a domain controller manager 824 which is in charge of managing the domain controller 514 itself. The functions of the domain controller manager 824 may include, for example, networking the domain controller 514, rebooting the domain controller 514, etc. Additionally, the domain controller manager 824 may permit the retrieval of logs from the underlying file system.

The domain controller 514 may further include a redundancy manager 826. The redundancy manager 826 is in charge of sending and/or receiving "heartbeats" from the domain controllers in the network, such as, for example, the secondary domain controller 524. The redundancy manager's 826 job is to ensure that when a domain controller dies, another will take over without interruptions in the system performance.

In one embodiment, the domain controller 514 may be operable to act as a Trivial File Transfer Protocol ("TFTP") for file transfers such as when doing file upgrades. Similarly, the domain controller 514 may be operable to act as a Dynamic Host Configuration Protocol ("DHCP") server for dynamic IP address configuration when the controller is unable to gather a physical location. Additionally, the domain controller 514 may be operable to act as a Simple Network Time Protocol ("SNTP") server to synchronize time for all the controllers in the network.

In addition to the managers 802, the domain controller 514 includes interfaces 804. In one embodiment, the domain controller 514 may include a scriptable Command Line Interface ("CLI") 828. In one embodiment, the command line interface may be written with features similar to Systems Management Architecture for Server Hardware ("SMASH")/Communication Link Protocol ("CLP"). All the system capabilities may be exposed through the scriptable CLI 828. The scriptable CLI 828 may communicate with an end-user 518 using the SSH or Telnet protocol.

With the serial console service 712 in the buffered mode, the end-user 518 may log into the domain controller 514 to access the CLI 828. In the CLI 828, the end-user 518 may type the command to request the buffered data. In response the CLI 828 executes a task in the device manager 806. The device manager 806 may then send a TCP/IP message to the proper node controller 502 requesting the buffered serial data. The node controller 502 will then create a reply message and place its FIFO buffered data into that reply. This message is received by the device manager 806 through the network and the device manager 806 will reply to the CLI 828 with the data. The data may then be displayed by the CLI 828. When in the buffered mode, the transfer of serial data from the motherboard to the node controller's 502 FIFO is never interrupted.

In one embodiment, the serial console service 712 may also be operable in the interactive mode which allows an end-user 518 to interact with a server 107 through its serial port. In this embodiment, the end-user 518 may log into the domain controller 514 to access the CLI 828 via SSH or Telnet. The end-user 518 may then type in the command to start an interactive session with a server 107 in a sled 106. At this point, the CLI 828 executes a task in the device manager 806. The device manager 806 sends a TCP message to the proper node controller 502 requesting the start of the interactive session. The node controller 502 may then acknowledge the command and reply to the domain controller 514 that it is ready. Additionally, the node controller 502 may spawn a threat that will send and receive data from the Universal Asynchronous Receiver/Transmitter ("UART"). The device manager 806 replies to the CLI 828 that the connection is ready and the CLI 828 starts a TCP connection to the node controller 502 with the port given to receive and send data. Every time a character is received, it may be forwarded to the node controller 502 which will in turn forward the received character to the serial port of the particular server 107. At this point, the node controller 502 may read the serial port of the server 107 and send the response back through the TCP connection to the CLI 828. The thread/process at the device manager 806 may then put the data in the CLI 828. The end-user 518 may exit the interactive session by inputting the appropriate commands to the CLI 828. If the buffered mode is enabled, it will not interfere with the interactive session. Instead, it should behave normally and record the output of the serial console service 712. Further, since the domain controller 514 has a serial port, a customer may access the CLI 828 through this port and perform any CLI commands, including serial over LAN to a server 107.

The domain controller 514 interfaces 804 may further include SNMP 830 which can be used to perform basic system operations, such as, for example, power managing the nodes, read inventory, etc.

An Intelligent Platform Management Interface ("IPMI") 832 may allow a user 518 to send IPMI or Data Center Manageability Interface ("DCMI") messages through a Local Area Network ("LAN") to the domain controller 514. The domain controller 514 may provide IP aliasing to expose several IP addresses to the network, each one associated with a specific sled 106. The message is received by the domain controller 514 and forwarded to the proper sled 106. The node controller 502 may handle the raw IPMI package contained inside the Remote Management and Control Protocol+ ("RMCP+") message, and any IPMI software stack is handled at the domain controller 514.

An IPMI interface may also exist for each rack 102 in the domain controller 514 that may provide OEM commands for rack-level management. For instance, the rack level management may include listing inventory of the chassis 104 in a rack 102, including the sleds 106 inserted therein, the sled 106 locations within the chassis 104, the IPMI address of the sleds 106 to be managed and the status of the sleds 106. Additionally, the rack level management may include information on fan controllers 508 such as, for example, the status of each fan 108 and/or the speed of each fan 108. The rack level management may further include information on the power module controllers 512 such as the status of each PDU, the power being consumed, as well as a display of critical measures of the chassis 104 such as the total power consumption and the maximum temperature.

The domain controller 514 may further include SMASH interfaces 834. SMASH is a standard management framework that may be placed on top of the managers 802. As is appreciated by those of ordinary skill in the art, SMASH uses an object oriented approach to define the management and monitoring capabilities of a system, and uses "providers" to get data from the management system into this object oriented framework. An advantage of using SMASH interfaces is that they permit the use of standard user interfaces such as SMASH/CLP 836 for command line interfaces and Common Information Model ("CIM")/Extensible Markup Language ("XML") or Web Service-Management ("WS-MAN") 838 for web services.

In one embodiment, an Operating System watchdog 840 may constantly check the status of the different system components and restart the necessary components in the event of a failure or crash.

In one embodiment, the domain controller 514 may be in charge of enforcing a power cap if it was setup by the user as part of a rack-level power capping policy. In this embodiment, the power monitoring sensors (not shown) may be updated at a predetermined frequency. A power threshold may perform exceptions actions as requested in the form of power cycling option or a log if power consumption exceeds the threshold limit for a specified amount of time. The exception time limit may be a multiple of the power monitoring sampling time. During operation, the user 518 may define a preset total power cap for the chassis 104. The domain controller 514 may then send a message to the node controller 502 to start power cap. This message may include a power threshold, an exception time limit, the action to take if the exception time limit is exceeded, and an emergency time limit. The system may then be set up to cap to the threshold or simply log the event of exceeding the threshold. As would be appreciated by those of ordinary skill in the art, with the benefit of this disclosure, the threshold value may be designated as the average power consumption over a preset amount of time. In one embodiment, if the power consumption exceeds the threshold, a notification may be sent to the domain controller 514. If the power consumption falls below the threshold before the expiration of the time limit, the node controller 502 will take no further action. However, if the time limit expires then depending on the instructions received from the domain controller 514, the node controller 502 may enforce a cap or raise a notification. If the cap procedure implemented by the node controller 502 is successful, then the system continues its operations. If however the emergency time limit is reached and the power consumption has not gone below the threshold value, the servers 107 are powered off. In one embodiment, the node controller 502 may store the power capping settings in flash so that the settings are maintained, even after a reset. The domain controller 514 may enable or disable the power capping capabilities of the system. Accordingly, an end-user 518 may enable/disable power capping and/or designate the various power capping parameters through the CLI 828 and the domain controller 514.

In one exemplary embodiment, rack level blind-capping may be used to assign the power cap for the servers 107. In this embodiment, the cap is equally divided among all the servers 107 in the rack 102. This method is useful when all the servers have similar characteristics and provide similar functionality. In another embodiment, rack level fair-capping may be used to assign a power cap for the servers 107. In this embodiment, the power cap is enforced by allowing reallocation of power amongst the servers 107, avoiding as much as possible power capping of the servers that are busier (generally, those consuming more power). This is a continuous process, and it is a good approach to avoid reducing the performance of the most critical servers, although the performance of the servers that are consuming the least amount of power will be affected the most. As would be appreciated by those of ordinary skill in the art, with the benefit of this disclosure, in either method, if a server 107 cannot be capped any further (i.e. further attempts to reduce power consumption would fail) then it should be turned off so that the power budget is guaranteed.

In instances where the end-user 518 has specific performance goals for an application (e.g. response time of queries), power capping may be used to reduce the power in servers 107 while maintaining the performance goals, ultimately reducing the operating expenses of the chassis 104. Accordingly, the end-user 518 may first sample the power consumption in a rack 102 or a set of servers 107, and cap the system to reduce power. The end-user 518 may then measure the performance of the applications under the designated power scheme. This process may be repeated until an optimal performance and power capping configuration is identified.

In one exemplary embodiment, the end-user 518 may apply a cap to a server 107. In another embodiment, group-level blind capping may be used to determine the power cap for the system components. In this embodiment, once the optimal power cap has been identified through experimentation, the same cap may be applied to one or more servers in the rack 102 (the servers are expected to run the same applications that were used to determine the optimal cap). Since the scriptable CLI 828 permits an end-user 518 to set server-level power capping and read power consumption of the different devices in a rack 102, the end-user could control the power capping process from an external server.

In some instances, it may be desirable to use power capping in case of critical failures in the cooling system. For example, if the inlet temperature drastically increases, throttling the system components via capping could help to temporarily reduce the system temperatures without the need to wait for the internal thermal trip. Specifically, the end-user 518 may pre-set a desired percentage reduction in power consumption in the event the thermal sensor reading exceeds a certain temperature. The power consumption may then be reduced accordingly in the event of a thermal emergency.

In one embodiment, the end-user may obtain an estimate of the power consumption on a server 107 and/or the total consumption on a rack 102, including servers, fans, switches, etc. In this embodiment, the domain controller 514 has access to up-to-date sensor information from each controller, including the node controller 502 (for server level measurements) and power module controllers 512 (for PDU measurements). Accordingly, the total power consumed by a rack 102, a chassis 104 or by a server 107 at a given time can be computed. Additionally, the end-user may use the scriptable CLI 828 to read power consumptions of individual servers 107 and use these readings to perform computations on an external server.

Figure 9:
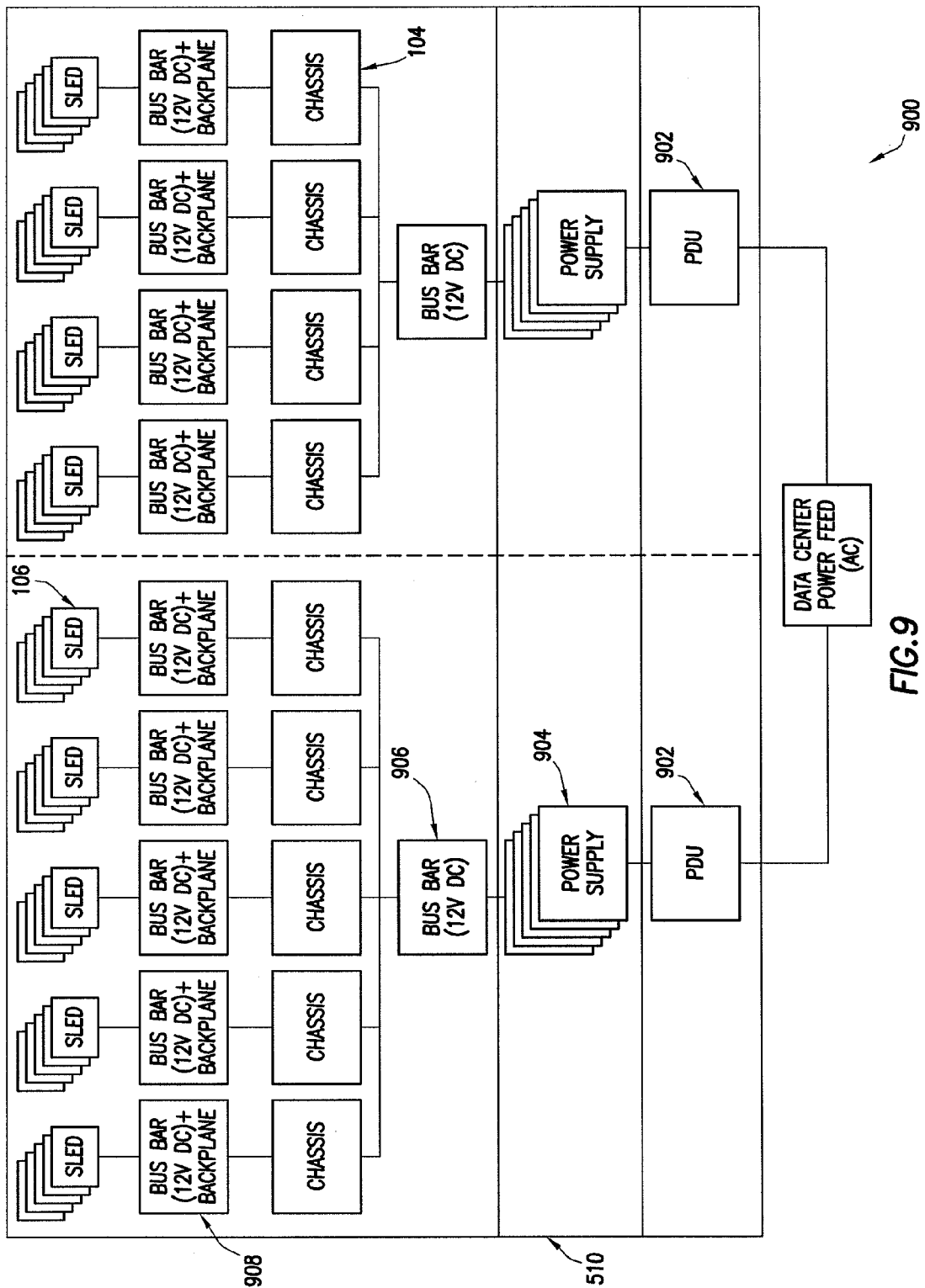
FIG. 9 is a shared power supply system in accordance with an exemplary embodiment of the present invention.

Turning now to FIG. 9, a shared power supply system in accordance with an exemplary embodiment of the present invention is denoted generally with numeral 900. In this exemplary embodiment, there are 5 sleds 106 per chassis 104. However, as would be appreciated by those of ordinary skill in the art, with the benefit of this disclosure, the methods and systems disclosed herein may be applied to different number of sleds 106 per chassis 104. In one embodiment, the shared power system 900 allows sharing 12[V] from a PDU 902 to one or more chassis 104. As shown in FIGS. 2 and 3, the sleds 106 may be connected to a common backplane 112 in the chassis 104 for power and management. In one embodiment, two or more 4 U chassis 104 may share a PDU 902 including 1+N PSUs 904 creating a power domain. Each rack 102 may include two or more power domains. Further, third party products, such as, for example, switches, may be provided in front of the PDU 902.

In one embodiment, a bus bar 906 may be used per chassis 104 to distribute power. Specifically, since chassis 104 are installed on top or above other chassis 104 or the power module 510, bus bars 906 in the back of the chassis 104 may be utilized to distribute power. In another exemplary embodiment, cables may be used to provide a direct-connect distribution of power from the power module 510 to each chassis 104.

Figure 10:
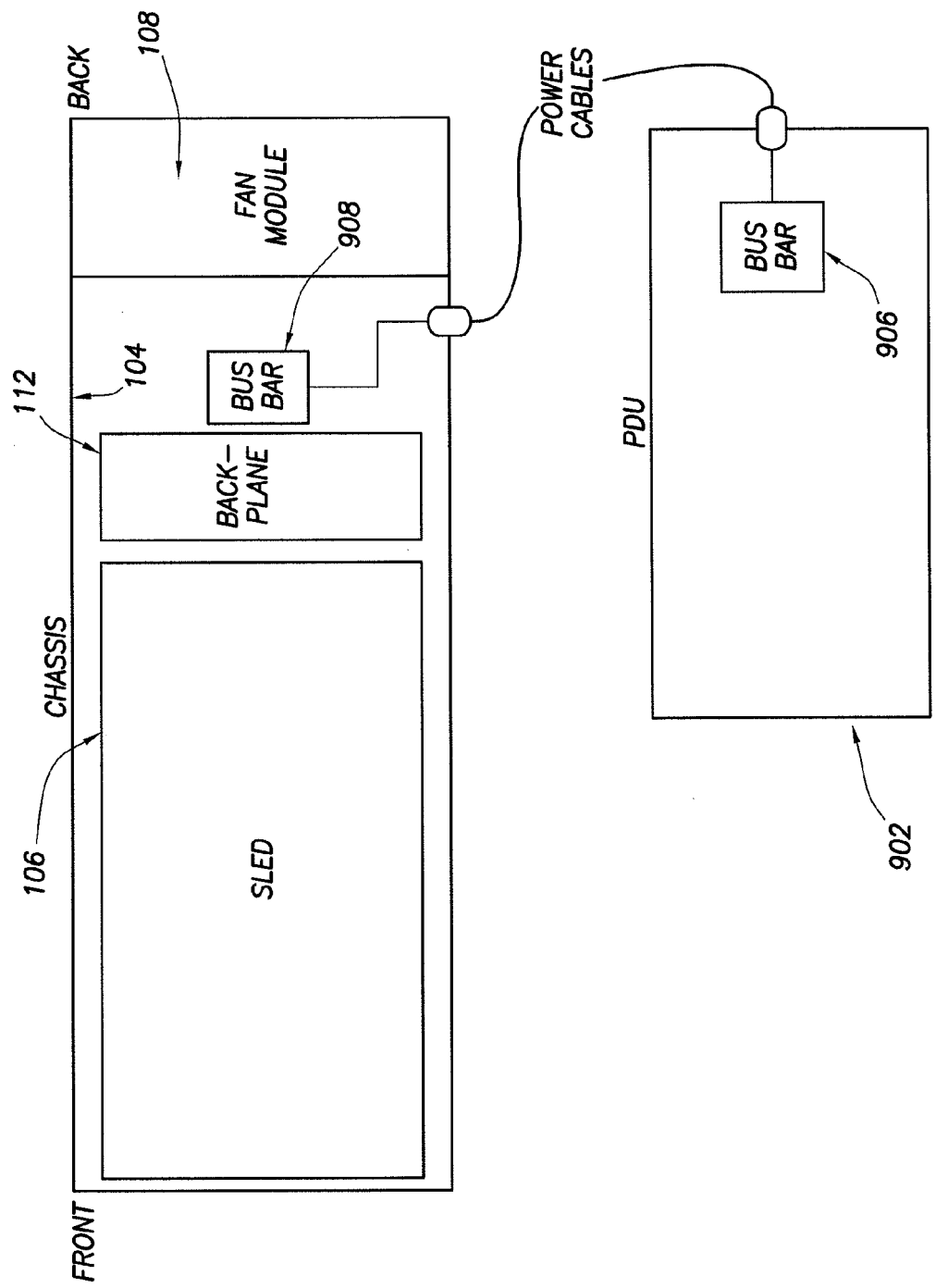
FIG. 10 depicts the connection of a chassis to a power distribution unit in accordance with an exemplary embodiment of the present invention.

FIG. 10 depicts the connection of a chassis 104 to a PDU 902. As would be appreciated by those of ordinary skill in the art, with the benefit of this disclosure, more than one chassis 104 may be connected to a PDU 902. Further, a PDU 902 may include one or more PSUs 904. In one embodiment, the PDU 902 may include N+1 PSUs 904 for redundancy, where N is the number of sleds 106 that are fed from the power supply. Specifically, using N+1 PSUs 904 allows the PDU 902 to satisfy the load requirements while providing redundancy so that if a PSU 904 dies, there remains an extra PSU 904 to take up the load. As shown in FIG. 10, the bus bar 906 of the PDU 902 may be connected to the bus bar 908 of the chassis 104 through one or more power cables. The bus bar 908 may then supply power to the sled 106 through the backplane 112.

Although the exemplary embodiments are described in conjunction with servers in a rack, as would be appreciated by those of ordinary skill in the art, with the benefit of this disclosure, the present invention is not limited to servers and may be used in conjunction with other information handling systems such as data storage devices. Additionally, the system and methods disclosed herein are not limited to systems including one rack and may be used in conjunction with two or more racks. As would be apparent to those of ordinary skill in the art, with the benefit of this disclosure, in multi-rack systems the domain controller 514 allows scalability and may support multi-rack management capabilities by connecting management switches from other racks into the aggregation switch 516.

Although the present disclosure has been described in detail, it should be understood that various changes, substitutions, and alterations can be made hereto without departing from the spirit and the scope of the invention as defined by the appended claims.

What is claimed is:

1. A modular information handling system framework comprising:
   a rack containing at least one chassis;
   at least two sleds placed within the chassis, wherein each sled includes at least one information handling system;
   a fan placed within the chassis and outside of the at least two sleds to cool the information handling systems;
   a fan controller communicatively coupled to the fan, wherein the fan controller manages operation of the fan;
   at least two node controllers, each node controller associated with a different one of the at least two sleds, wherein each node controller manages operation of the associated sled;
   a power module for supplying power to the information handling systems;
   a power module controller for managing operation of the power module;
   a primary domain controller communicatively coupled to at least one of the fan controller, the node controllers, and the power module, wherein the primary domain controller manages the operation of at least one of the fan controller, the node controllers and the power module; and
   a consolidation switch within each chassis coupled to a central management switch at a primary domain controller, wherein the consolidation switch provides a redundant point of access for a user through an interface;
   I2C signals that indicate to each sled its position in the chassis, wherein the I2C signals are used to send and receive data when any one of the node controllers cannot obtain an IP address or when the consolidation switch is damaged.

2. The system of claim 1, wherein the primary domain controller provides a user interface for the modular information handling system framework.

3. The system of claim 2, wherein the primary domain controller is operable to display information relating to performance of the modular information handling system framework to the user.

4. The system of claim 2, wherein the primary domain controller allows a user to control performance parameters of the modular information handling system framework.

5. The system of claim 1, further comprising a secondary domain controller, wherein the secondary domain controller manages the operation of at least one of the fan controller, the node controllers and the power module if the primary domain controller becomes inoperational.

6. The system of claim 5, further comprising a management appliance, wherein the management appliance contains one or more of the primary domain controller, the secondary domain controller and a management switch.

7. The system of claim 1, wherein the primary domain controller is communicatively coupled to at least one of the power module controller, the fan controller and the node controllers through a management network.

8. The system of claim 7, wherein the management network is an Ethernet network.

9. The system of claim 1, wherein each information handling system is selected from the group consisting of a server and a data storage device.

10. The system of claim 1, further comprising one or more sensors for monitoring operating conditions of at least one of the sleds, the fan and the power module.

11. The system of claim 10, wherein the one or more sensors are selected from a group consisting of a temperature sensor and a power monitoring sensor.

12. The system of claim 1, wherein the primary domain controller comprises one or more managers and one or more interfaces.

13. The system of claim 10, wherein the primary domain controller comprises:
   a device manager communicatively coupled to the one or more sensors;
      wherein the device manager receives sensor data from the one or more sensors;
   a domain controller manager to manage the primary domain controller;
   a security manager to authenticate connections to the primary domain controller; and
   a notification manager to monitor sensor data received by the device manager.

14. The system of claim 13, wherein the notification manager generates a notification if sensor data indicates occurrence of an event of interest.

15. The system of claim 14, wherein the event of interest is selected from the group consisting of sensor data indicating a temperature exceeding a threshold temperature value and sensor data indicating power consumption exceeding a threshold value.

16. The system of claim 14, wherein the notification manager generates the notification to an end user through a user interface.

17. The system of claim 5, wherein the primary domain controller comprises a redundancy manager, wherein the redundancy manager allows communications between the primary domain controller and the secondary domain controller.

18. The system of claim 17, wherein operations of the primary domain controller are transferred to the secondary domain controller if the secondary domain controller is unable to communicate with the redundancy manager.

19. The system of claim 13, wherein the device manager includes a cache for buffering sensor data received from the one or more sensors.

20. The system of claim 19, wherein the sensor data is moved into permanent memory from the cache at a predetermined frequency.

21. The system of claim 1, wherein the fan controller comprises:
   an identification service to identify the physical location of the fan controller within the system;
   a notifier service operable to send messages from the fan controller to the primary domain controller;
   a command listener service to receive messages from the primary domain controller;
   a monitoring service;
      wherein the monitoring service keeps track of data from the one or more sensors associated with the fan,
   a dynamic fan control to regulate speed of the fan based on the information available from the monitoring service;
   a log service operable to receive and store messages from components of the fan controller; and
   a heartbeat signal to determine if the fan controller is operating.

22. The system of claim 21, wherein the monitoring service generates a signal to the notifier service if data from the one or more sensors indicates an event of interest.

23. The system of claim 21, wherein the dynamic fan control includes a proportional-integral-derivative controller.

24. The system of claim 21, wherein the heartbeat signal directs the fan to operate at maximum speed if the fan controller is inoperational.

25. The system of claim 1, wherein the node controllers manage power to the associated sleds.

26. The system of claim 1, wherein the node controller comprises:
   an identification service to identify the physical location of the node controller within the system;
   a notifier service operable to send messages from the node controller to at least one of the primary domain controller and the fan controller;
   a command listener to receive messages from the primary domain controller;
   a serial console service to interface with the information handling system;
   a monitoring service;
      wherein the monitoring service keeps track of data from one or more sensors associated with the sled, and
   a log service operable to receive and store messages from one or more components of the node controller.

27. The system of claim 26, wherein the monitoring service is operational to generate a signal to the notifier service if data from the one or more sensors indicates an event of interest.

28. The system of claim 1, wherein the node controller is communicatively coupled to the fan controller.

29. The system of claim 1, wherein the fan controller and the node controllers includes configuration files containing operational parameters.

30. The system of claim 1, wherein the primary domain controller is operable to configure the configuration files of the fan controller and the node controllers.

31. A modular rack system comprising:
   a plurality of chassis placed in one or more racks;
   a plurality of sleds placed in each chassis, wherein each sled includes an information handling system;
   at least two node controllers, each node controller associated with a different one of the plurality of sleds, wherein each node controller manages operation of an associated sled;
   a consolidation switch within each chassis coupled to a central management switch at a primary domain controller, wherein the consolidation switch provides a redundant point of access for a user through an interface;
   I2C signals that indicate to each sled its position in the chassis, wherein the I2C signals are used to send and receive data when any one of the node controllers cannot obtain an IP address or when the consolidation switch is damaged;
   a shared fan module positioned within the chassis and outside of the plurality of sleds to cool the plurality of sleds in each chassis;
   a shared power module to supply power to one or more sleds in one or more chassis; and
   a shared management module to manage operation of the plurality of chassis.

32. The system of claim 31, wherein the shared fan module comprises one or more fans and a fan controller to control operation of the shared fan module.

33. The system of claim 32, wherein the fan controller comprises:
   an identification service to identify the physical location of the fan controller within the system;
   a notifier service operable to send messages from the fan controller to the primary domain controller;
   a command listener service to receive messages from the primary domain controller;
   a monitoring service;
      wherein the monitoring service keeps track of data from the one or more sensors associated with the fan,
   a dynamic fan control to regulate speed of the fan based on the information available from the monitoring service;
   a log service operable to receive and store messages from components of the fan controller; and
   a heartbeat signal to determine if the fan controller is operating.

34. The system of claim 33, wherein the monitoring service is operational to generate a signal to the notifier service if data from the one or more sensors indicates an event of interest.

35. The system of claim 31, wherein the shared power module comprises a power distribution unit and a power module controller to control operation of the shared power module.

36. The system of claim 35, wherein the power distribution unit comprises one or more power supply units.

37. The system of claim 31, wherein the shared management module comprises a primary domain controller.

38. The system of claim 37, wherein the primary domain controller enforces a power capping policy.

39. The system of claim 37, wherein the primary domain controller tracks power consumption of one or more components of the modular rack system.

40. The system of claim 37, further comprising a secondary domain controller that replaces the primary domain controller if the primary domain controller becomes inoperational.

41. The system of claim 37, wherein the primary domain controller comprises:
   a device manager communicatively coupled to one or more sensors;
      wherein the one or more sensors monitor operating conditions of at least one of a sled, a component of the shared fan module, and a component of the shared power module;
      wherein the device manager receives sensor data from the one or more sensors;
   a domain controller manager operable to manage the primary domain controller;
   a security manager operable to authenticate connections to the primary domain controller; and
   a notification manager operable to monitor sensor data received by the device manager.

42. The system of claim 41, wherein the notification manager is operable to generate a notification if sensor data indicates occurrence of an event of interest.

43. The system of claim 37, further comprising a node controller associated with a sled.

44. The system of claim 43, wherein the node controller comprises:
   an identification service to identify the physical location of the node controller within the system;
   a notifier service operable to send messages from the node controller to at least one of the primary domain controller and the shared fan module;
   a command listener to receive messages from the primary domain controller;
   a serial console service to interface with the information handling system in the sled;
   a monitoring service;
      wherein the monitoring service keeps track of data from one or more sensors associated with the sled, wherein the monitoring service is operational to generate a signal to the notifier service if data from the one or more sensors indicates an event of interest; and a log service operable to receive and store messages from one or more components of the node controller.

45. The system of claim 31, wherein the shared fan module, the shared power module and the shared management module are communicatively coupled through a management network.

46. The system of claim 45, wherein the management network is an Ethernet network.

47. The system of claim 31, wherein power is distributed to the sleds through a chassis backplane.

\* \* \* \* \*